United States Patent
Kong et al.

(10) Patent No.: US 8,296,690 B1
(45) Date of Patent: Oct. 23, 2012

(54) METHOD AND ARRANGEMENT PROVIDING FOR IMPLEMENTATION GRANULARITY USING IMPLEMENTATION SETS

(75) Inventors: Raymond Kong, San Francisco, CA (US); Daniel J. Downs, Longmont, CO (US); John J. Laurence, Westminster, CO (US); Richard Yachyang Sun, Mountain View, CA (US); Sankaranarayanan Srinivasen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 646 days.

(21) Appl. No.: 12/027,501

(22) Filed: Feb. 7, 2008

Related U.S. Application Data (62) Division of application No. 10/913,000, filed on Aug. 6, 2004, now Pat. No. 7,360,177.

(51) Int. Cl.
*G06F 17/50* (2006.01)

(52) U.S. Cl. ........ 716/100; 716/103; 716/104; 716/105; 716/110; 716/116; 716/119; 716/122

(58) Field of Classification Search .......... 716/100–105, 716/110–111, 116, 119–125
See application file for complete search history.

(56) References Cited

U.S. PATENT DOCUMENTS

| | | | |
|---|---|---|---|
| 5,661,663 A | 8/1997 | Scepanovic et al. | |
| 5,778,216 A | 7/1998 | Venikatesh | |
| 5,867,396 A | 2/1999 | Parlour | |
| 5,870,308 A | 2/1999 | Dangelo et al. | |
| 5,930,500 A | 7/1999 | Scepanovic et al. | |
| 6,009,251 A | 12/1999 | Ho et al. | |
| 6,026,226 A | 2/2000 | Heile et al. | |
| 6,216,252 B1* | 4/2001 | Dangelo et al. | 716/1 |
| 6,339,836 B1 | 1/2002 | Eisenhofer et al. | |
| 6,408,428 B1 | 6/2002 | Schlansker et al. | |
| 6,490,717 B1 | 12/2002 | Pedersen et al. | |
| 6,536,031 B2 | 3/2003 | Ito et al. | |
| 6,539,533 B1 | 3/2003 | Brown, III et al. | |
| 6,539,536 B1* | 3/2003 | Singh et al. | 716/18 |
| 6,574,788 B1 | 6/2003 | Levine et al. | |
| 6,622,291 B1 | 9/2003 | Ginetti | |
| 6,625,797 B1 | 9/2003 | Edwards et al. | |
| 6,845,494 B2 | 1/2005 | Burks et al. | |
| 6,854,096 B2 | 2/2005 | Eaton et al. | |
| 6,871,336 B1 | 3/2005 | Anderson | |

(Continued)

OTHER PUBLICATIONS

Xilinx, Inc., "Constraints Guide," ISE 6.1i, copyright 1994-2003, pp. 1-12, downloaded Jun. 1, 2004 from http://toolbox.xilinx.com/docsan/xilinx6/books/data/docs/cgd/cgd0001_1.html.

(Continued)

*Primary Examiner* — Paul Dinh
(74) *Attorney, Agent, or Firm* — Pablo Meles; Kevin T. Cuenot (57) ABSTRACT

A design hierarchy based on an implementation set abstraction of a user design for an integrated circuit design includes a plurality of nodes and a definition for each of the nodes in the plurality of nodes that describes the type of elements contained in each node and the hierarchy defined by each of the nodes. Each node can include at least one implementation element of the design and the at least one implementation element can be selected among the group including a set of logical elements, a set of placed elements, and a set of placed and routed elements.

20 Claims, 8 Drawing Sheets

U.S. PATENT DOCUMENTS

| | | | |
|---|---|---|---|
| 6,999,910 | B2 | 2/2006 | Koford et al. |
| 7,003,753 | B2 | 2/2006 | Teene |
| 7,086,029 | B1 * | 8/2006 | Barras et al. ............ 716/17 |
| 7,103,863 | B2 | 9/2006 | Riepe et al. |
| 7,146,583 | B1 | 12/2006 | Downs et al. |
| 7,149,993 | B1 | 12/2006 | Aggarwal et al. |
| 7,171,644 | B1 | 1/2007 | Laurence et al. |
| 7,181,704 | B1 | 2/2007 | Downs et al. |
| 7,290,241 | B1 | 10/2007 | Downs et al. |
| 2002/0016952 | A1 | 2/2002 | Chang et al. |
| 2002/0194572 | A1 * | 12/2002 | McElvain et al. ............ 716/1 |
| 2003/0131325 | A1 * | 7/2003 | Schubert et al. ............ 716/4 |
| 2004/0078767 | A1 | 4/2004 | Burks et al. |
| 2004/0098689 | A1 | 5/2004 | Weed |
| 2004/0225972 | A1 | 11/2004 | Oeltjen et al. |
| 2005/0114818 | A1 | 5/2005 | Khakzadi et al. |
| 2005/0149898 | A1 | 7/2005 | Hakewill et al. |
| 2005/0268258 | A1 * | 12/2005 | Decker ............ 716/4 |
| 2005/0289485 | A1 * | 12/2005 | Willis ............ 716/1 |

OTHER PUBLICATIONS

Xilinx, Inc., "Development System Reference Guide," copyright 1994-2003, pp. 1-64, downloaded Jun. 1, 2004 from http://toolbox.xilinx.com/docsan/xilinx6/books/data/docs/dev/dev0001_1.html.

Xilinx, Inc., "Guided Mapping," Dec. 15, 2005, pp. 1-2, downloaded Jun. 16, 2006 from http://toolbox.xilinx.com/docsan/xilinx5/data/docs/dev/dev0058_12.html.

Xilinx, Inc., "Guided PAR," Dec. 15, 2005, pp. 1-3, downloaded Feb. 9, 2006 from http://toolbox.xilinx.com/docsan/xilinx5/data/docs/dev/dev0078_14.html.

Xilinx, Inc., "Incremental Design Overview," Dec. 15, 2005, downloaded Jun. 16, 2006 from http://toolbox.xilinx.com/docsan/xilinx5/data/docs/dev/dev0018_7.html.

Xilinx, Inc., "Modular Design Overview," Dec. 15, 2005, pp. 1-2, downloaded Jun. 16, 2006 from http://toolbox.xilinx.com/docsan/xilinx5/data/docs/dev/dev0022_8.html.

Xilinx, Inc., "Modular Design Tips," Dec. 15, 2005, pp. 1-5, downloaded Jun. 16, 2006 from http://toolbox.xilinx.com/docsan/xilinx5/data/docs/dev/dev0028_8.html.

Xilinx, Inc., "Running the Sequential Modular Design Flow," Dec. 15, 2005, pp. 1-5, downloaded Jun. 16, 2006 from http://toolbox.xilinx.com/docsan/xilinx5/data/docs/dev/dev0027_8.html.

U.S. Appl. No. 10/913,000, filed Aug. 6, 2004, Kong et al.

U.S. Appl. No. 12/028,337, filed Feb. 8, 2008, Kong et al.

* cited by examiner

METHOD AND ARRANGEMENT PROVIDING FOR IMPLEMENTATION GRANULARITY USING IMPLEMENTATION SETS

FIELD OF THE INVENTION

The invention relates to the field of circuit design and, more particularly, to a unifying data model and paradigm for implementing a circuit design.

BACKGROUND OF THE INVENTION

Circuit designs, and particularly designs for Field Programmable Gate Arrays (FPGA's), have become increasingly complex and heterogeneous. Modern circuit designs can include a variety of different components or resources including, but not limited to, registers, block Random Access Memory (RAM), multipliers, processors, and the like. This increasing complexity makes design tools, maintenance of design tools as well as placement and signal routing of circuit designs more cumbersome. Existing design tools can have multiple flows that fail to be uniform, further adding to the complexity in the tools and their maintenance. Furthermore, existing design tools fail to provide sufficient flexibility in terms of representing design granularity in a particular design.

Xilinx software implementation tools currently support a number of user flows including a "conventional flow" and a set of "user interactive" flows. The conventional flow is characterized by a single design iteration while the user interactive flows require two (2) or more design iterations through the tools. These user interactive flows refer to a collection of 5 flows, namely Normal Guide Exact flow, Normal Guide Leverage flow, Incremental Design flow, Modular Design flow, and Partial Reconfiguration flow. Each flow addresses a specific set of customer needs.

For Normal Guide Exact flow, its primary use is to incorporate design changes based upon a previous physical implementation where the underlying objective is to incorporate the changes while preserving the performance of the previous implementation. As for Normal Guide Leverage and Incremental Design flows, their primary applications are also to incorporate and implement design changes to an existing design. However, the objective for Normal Guide Leverage and Incremental Design flow is to minimize the overall implementation run-time. For Modular Design flow, it serves two primary use cases, namely: (1) to provide a software infrastructure that allows for a divide-and-conquer approach used to manage design complexity by tackling smaller sub-designs; and (2) to provide a software infrastructure to support a parallel team design environment where a single design is divided into sub-designs. In turn, each partitioned sub-design is implemented independently by different team members. The final design is then assembled from previously implemented sub-designs. Lastly, the Partial Reconfiguration flow takes advantage of the underlying Xilinx FPGA device feature of partial bit stream re-programming which allows for the loading of a partial bit stream onto a Xilinx FPGA device while it is active and operational on the unchanged bit stream portion. From a software perspective, the Partial Reconfiguration flow is supported as a sub-flow or a variation of the Modular Design flow.

Due to historical reasons, each of the user interactive flows has been designed separately and for the most part defect driven. The evolution of these flows has taken separate and independent paths. Without a common theme among these user interactive flows, it was inevitable that the relevant concepts, methodology, and implementation became fractured. As a result, inefficiencies arose and customer flow complexity increased. Each interactive flow required a different set of knowledge, terminology, and procedure that posed as an obstacle to ease-of-use. In addition, the internal implementation increased in the development overhead as each user interactive flow was supported separately.

One of the root causes identified for why the prior interactive flows diverged was that each interactive flow operated on a different notion or implementation of how a partial net-list is specified. Specifically, under Incremental Design flow, the partial net-list of interest is specified by the contents of an Area Group. Similarly, under Modular Design and Partial Reconfiguration flows, the partial net-list is specified by either an Active Module or a previously implemented module (or PIM). Lastly, under Normal Guide Exact, Leverage, and conventional flows, the partial net-list is given by the entire design. As the result, the client application implementations became dependent of each flow and required the software overhead of understanding and processing the various data representations. In addition, due to the complexity of each interactive flow, the software maintenance and enhancements became an increasing overhead and burden on engineering staff resources. Furthermore, there were other notions of partial net-lists in the software system such as: modules, hard macro, and soft IP core. Each of these design entities were implemented and supported separately. As the software system evolves with an increasing number of these design entities, the resulting software complexity and impact will be significant.

SUMMARY OF THE INVENTION

The new paradigm alluded to above introduces the notion of an Implementation Set (I-Set) to provide a common and singular paradigm for which all interactive flows can operate upon. I-Set exploits the notion of implementation granularity and provides a flow independent concept to how a partial net-list is specified. By providing a unifying data model such as I-Set, client applications (such as design tools) can significantly simplify their interface to the underlying net-list information. Effectively, client applications no longer need to distinguish between different net-list entities such as user floor-planned partitioning (e.g., area groups), modules, and flat designs in its implementation. Client applications such as design implementation tools can focus solely on I-Sets instead of being concerned with flow information and the different net-list entities associated with each flow.

The present invention provides a method, system, and apparatus for performing circuit design. More particularly, an exemplary embodiment of the present invention provides a solution for simplifying circuit design and the associated maintenance of design tools used in circuit design. The simplification involves the introduction of an abstraction used for an integrated circuit design including a plurality of implementation sets formed in response to inputs to an implementation set factory, where the plurality collectively represents an entire net-list associated with the integrated circuit design and each implementation set contains a list of net-list blocks and a list of signals incident to and connected to the net-list blocks. Each implementation set can correspond to a net-list entity in a one-to-one mapping or in a one-to-many mapping. Each net-list block can represent a logical or a physical component.

In another embodiment of the present invention, a method of designing an integrated circuit design can include the steps of specifying a plurality of implementation sets containing net-list logic in a user designed hierarchy and preserving user design granularity using the plurality of implementation sets. The user designed hierarchy can be specified using a hardware description language. The method can further include the step of introducing different design granularity for the plurality of implementation sets suitable for a given implementation tool.

In yet another embodiment of the present invention an abstraction used in designing an integrated circuit design can include an implementation set forming a container of net-list logic and a means for maintaining a hierarchical format during a design implementation flow process. Note that the implementation set can be maintained in a hierarchical format where the underlying the net-list logic can have one or more levels of hierarchy.

Further note that each implementation set can be treated separately and implemented independently and that multiple abstractions can be made for the same user design by specifying an alternative plurality of implementation sets for the integrated circuit design.

Another embodiment of the present invention can include a design hierarchy based on an implementation set abstraction of a user design for an integrated circuit design including a plurality of nodes and a definition for each of the nodes in the plurality of nodes that describes the type of elements contained in each node and the hierarchy defined by each of the nodes. Each node can include at least one implementation element of the design and the at least one implementation element can be selected among the group including a set of logical elements, a set of placed elements, and a set of placed and routed elements. The definition for each node can provide a design granularity on the level selected among logical modules, active modules in a design with a plurality of levels of hierarchy, user floor-planned partitioning, an entire design, and a grouping of net-list logic along with placed and routing information for a single level hierarchy forming a relocatable module. Each node can be considered an implementation set as described in other embodiments discussed above.

Other embodiments of the present invention, when configured in accordance with the inventive arrangements disclosed herein, can include a system for performing, and a machine readable storage for causing a machine to perform, the various processes disclosed herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION

The present invention provides a solution for simplifying the implementation of circuit designs and associated maintenance without limiting or restricting granularity by using an abstraction called implementation sets or I-Sets.

Figure 1:
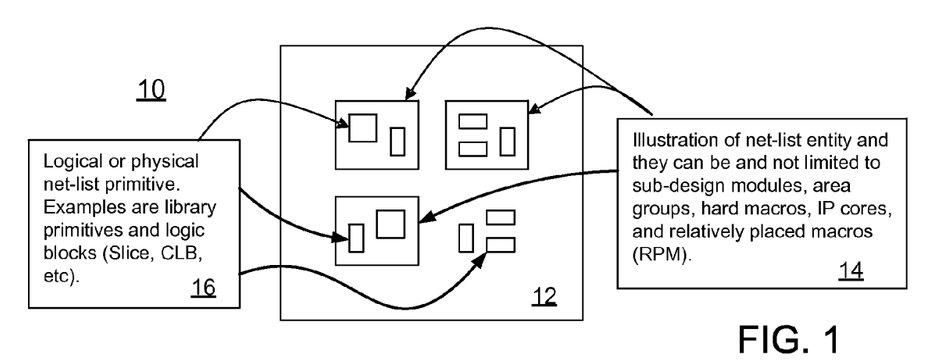
FIG. 1 is a sample design illustrating net-list entities and logical or physical net-list primitives in accordance with one embodiment of the inventive arrangements disclosed herein.

Circuit designs or circuit design representations can include any physical description of a circuit design in terms of the components to be used, including but not limited to, net-lists, circuit descriptions conforming to open standards such as the Berkeley Logic Interchange Format (BLIF), as well as circuit descriptions conforming to proprietary standards such as Native Circuit Description as used by Xilinx, Inc. of San Jose, Calif. For example, as shown in FIG. 1, a sample circuit design representation 10 can include a circuit design 12 having a plurality of net-list entities 14 such as sub-design modules, user floor-planned partitioning, hard macros, IP cores, and relatively placed macros each having logical or physical net-list primitives 16 such as library primitives and logic blocks such as slices and configurable logic blocks (CLBs). For simplicity, user floor-planned partitioning or area groups, active modules, inactive modules, PIMs, hard macros, soft IP cores, and RPMs can be generically referred to as net-list entities or logic blocks.

An I-Set can be an abstraction that contains and/or references all necessary design information to implement a specific portion of a single design or a sub-design. In other words, an I-Set can be considered a container of net list logic that can include either a portion of a design or an entire design. Without loss of generality, the sub-design may represent a single design in its entirety. An I-Set has several important aspects including partial net list information and implementation directives.

Each I-Set contains a list of net-list blocks and a list of signals that are incident to and are coupled to those blocks. A single design can be expressed by a collection of I-Sets where each I-Set represents a portion of the entire design net-list. Conversely, a collection of I-Sets can represent an entire net list associated with a single design. The I-Set abstraction provides an alternative grouping of the user design logic that is more suitable for a particular implementation flow or an implementation tool in question. I-Sets can be created based on user design constraints and/or internally based upon an implementation tool's needs. Note that the I-Set abstraction does not alter the underlying design hierarchy. Further note that one or more I-Sets can exist for a giver user design.

An implementation set contains a list of blocks and signals such that the member blocks and signals are hierarchical. In other words, each member block and signal can contain one or more child descendents. Basically, the implementation set concept can apply to a design that is expressed hierarchically. An I-Set abstraction can be organized in a hierarchical manner such that each I-Set can have one or more child descendent I-Sets. In addition, the parent/child relations can be expressed as implementation dependencies. Specifically, all child logic must be implemented before any of its parent logic. Note that sibling I-Sets can be implemented in parallel since there are no parent/child relations among them.

Figure 2:
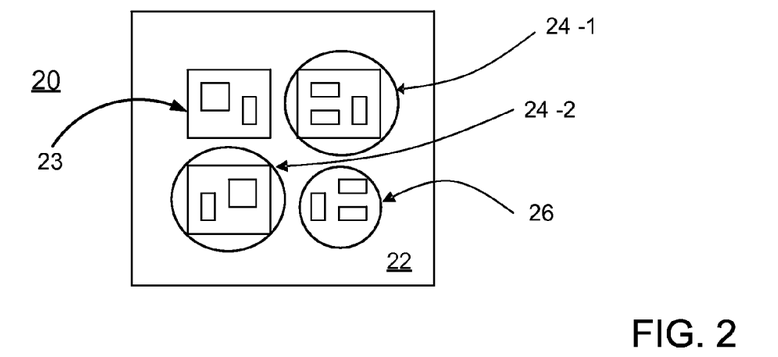
FIG. 2 is the sample design of FIG. 1 illustrating a sample I-Set with a one-to-one mapping to net-list entity in accordance with one embodiment of the inventive arrangements disclosed herein.
Figure 3:
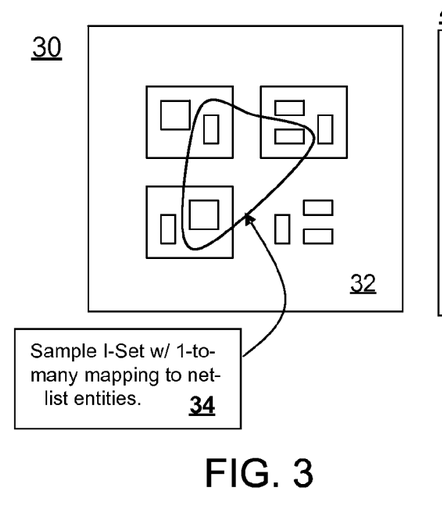
FIG. 3 is the sample design of FIG. 1 illustrating a sample I-Set with a one-to-many mapping to net-list entities in accordance with one embodiment of the inventive arrangements disclosed herein.
Figure 4:
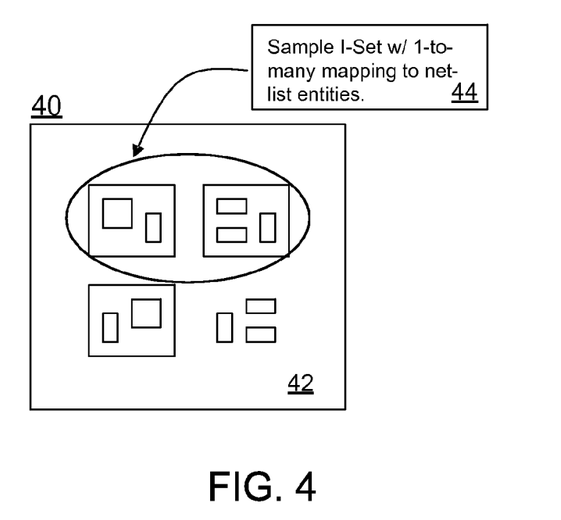
FIG. 4 is the sample design of FIG. 1 illustrating another sample I-Set with a one-to-one mapping to net-list entities in accordance with one embodiment of the inventive arrangements disclosed herein.

In one embodiment, each I-Set corresponds to a net-list entity and maintains a 1-to-1 mapping as shown in FIG. 2 where a circuit design representation 20 includes a circuit design 22 with sample I-Sets 24-1 and 24-2 that have a one-to-one mapping to net-list entity. I-Set 26 illustrates a sample I-Set of net-list primitives. In another embodiment with two variations as shown in FIGS. 3 and 4 having circuit design representations 30,40 and circuit designs 32,42 respectively, each I-Set corresponds to more than one net-list entities, thus maintaining a 1-to-many mapping. In FIG. 4, the net-list entity is referenced by a corresponding I-Set 44 in its entirety. Whereas, in the FIG. 3, each I-Set 34 can contain the partial contents of a net-list entity. Thus, it follows that I-Set mapping is not restricted to follow the membership boundary as posed by each net-list entity.

Figure 2A:
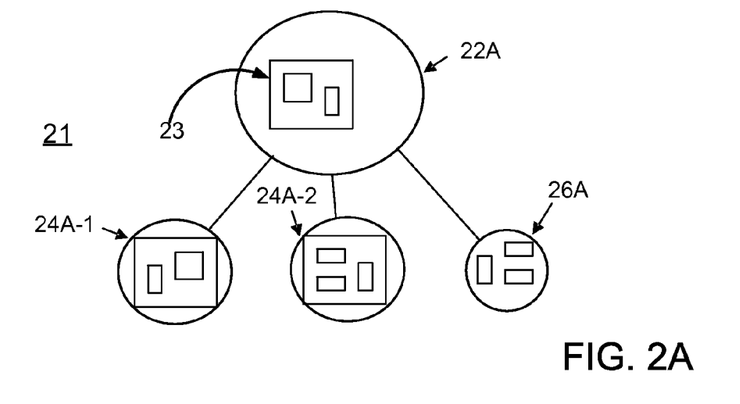
FIG. 2A is an implementation tree corresponding to the sample I-Set and hierarchy of FIG. 2.
Figure 3A:
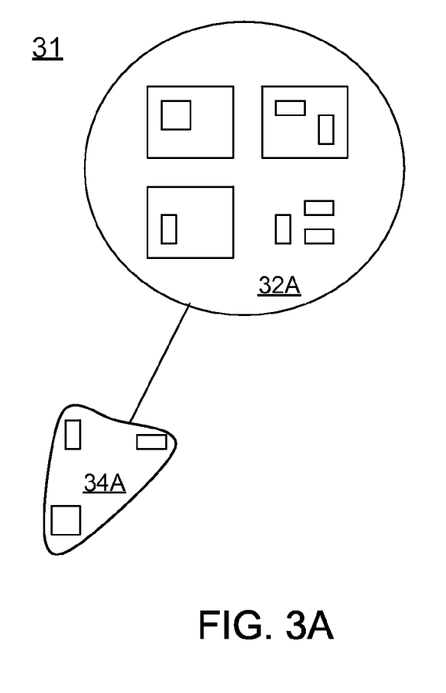
FIG. 3A is an implementation tree corresponding to the sample I-Set and hierarchy of FIG. 3.
Figure 4A:
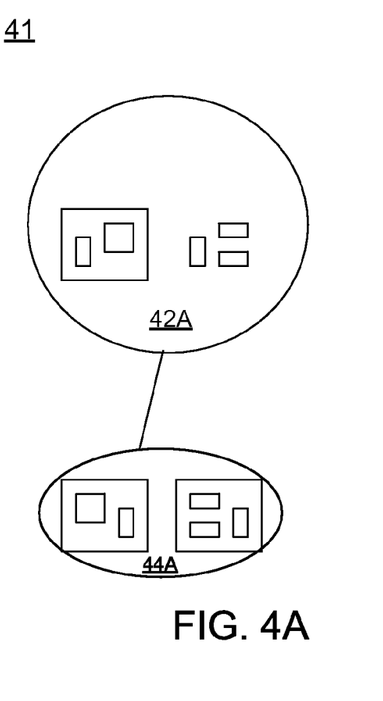
FIG. 4A is an implementation tree corresponding to the sample I-Set and hierarchy of FIG. 4.

Referring to FIGS. 2A, 3A, and 4A, I-Set trees 21, 31, and 41 correspond to the user or circuit designs 22, 32, and 42. Note, that although each user design is the same in each case, multiple I-Set trees having different I-Set configurations and hierarchies can be created. In one instance, I-set tree 21 includes child I-Sets 24A and 26A coupling to a top-level I-Set 22A. I-Set 22A includes all other elements (e.g., net-list entity 23) not otherwise included in child I-Sets 24A-1, 24A-2, and 26A. I-Set tree 31 includes child I-Set 34A coupling to top-level I-Set 32A. I-Set 32A includes all other elements not otherwise included in child I-Set 34A (where I-Set 34A has the three net-list primitives shown in set 34 of FIG. 3). I-Set tree 41 includes child I-Set 44A coupling to top-level I-Set 42A. I-Set 42A includes all other elements not otherwise included in child I-Set 44A (where I-Set 44A has the two net-list entities shown in set 44 of FIG. 4).

The partial net-list information in an I-Set is given by a list of blocks and signals. Each block is represented by but not limited to a net-list primitive or a placeable physical component (e.g. SLICE CLB). In addition, each I-Set contains a list of signals that are incident to or connects to the pins of those blocks. The set of signals is organized into 2 categories, namely "internal" and "external". The internal signals are those that have connectivity to those blocks in the same I-Set. Whereas, with external signals, they refer to signals that have connectivity or connect to one or more blocks not in the same I-Set.

Figure 5A:
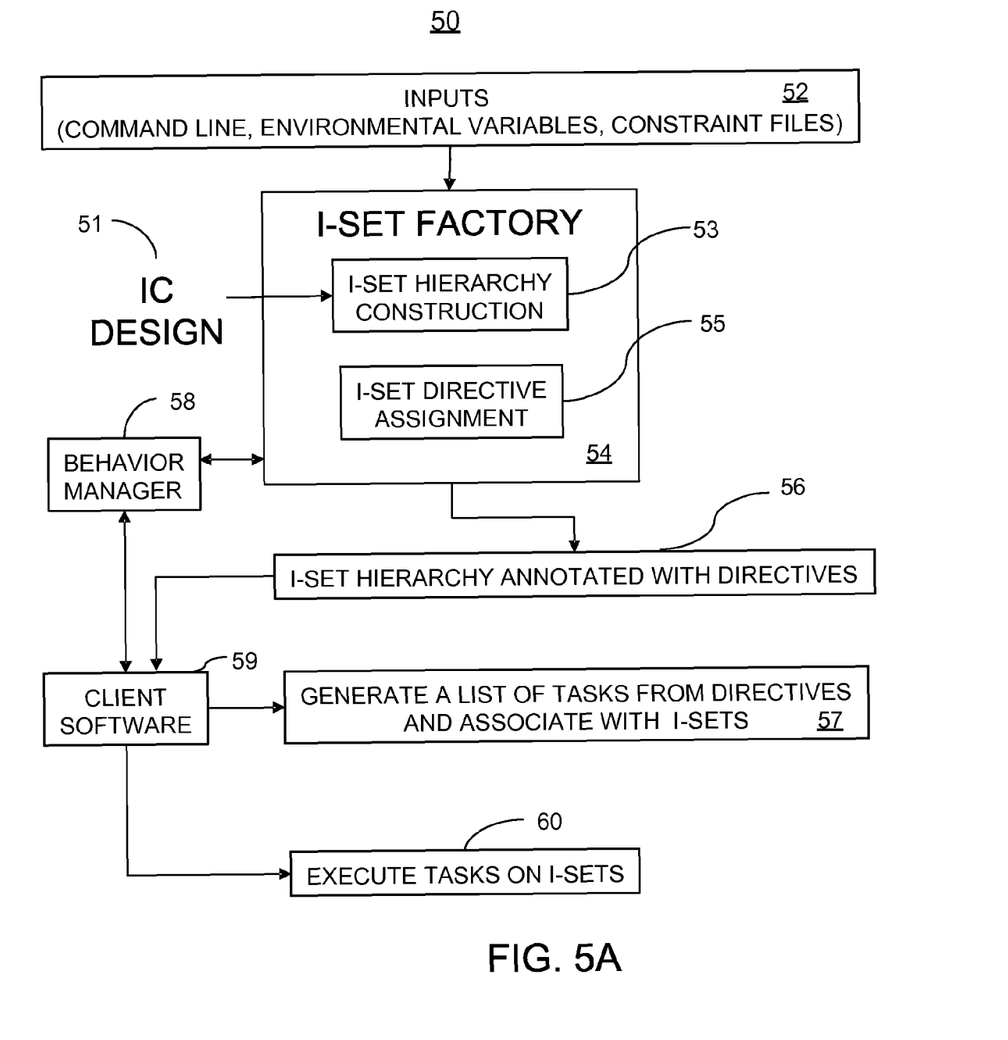
FIG. 5A is a flow chart illustrating the overall creating and use of I-Sets in circuit designs along with client software such as circuit design tools in accordance with the one embodiment of the present invention.
Figure 6:
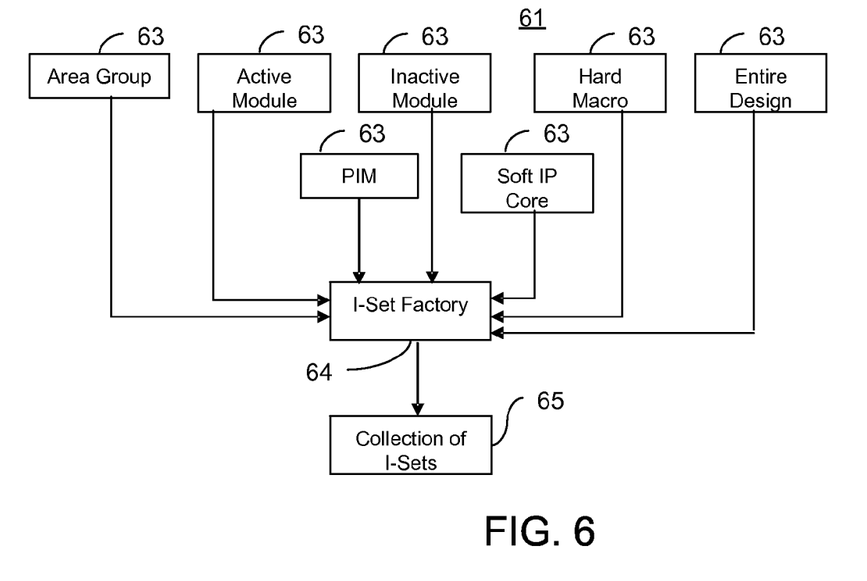
FIG. 6 is a block diagram illustrating how an I-Set factory uses one or more net-list entities as inputs and applies a predefined mapping to create a collection of I-Sets in accordance with one embodiment of the inventive arrangements disclosed herein.

In order to provide a singular representation of a partial net-list, a construction mechanism, referred to as I-Set factory, is introduced. An I-Set factory 54 is shown in FIG. 5A as part of an overall I-Set scheme 50 for creating circuit designs and in a narrower setting 61 in FIG. 6 illustrating the creation of a collection of I-Sets 65. An I-Set abstraction can be created using the I-Set factory, by a single entry point in an implementation tool flow process or by one or more implementation tools in the entire flow process. Possible usage models for an I-Set abstraction include an I-Set abstraction used strictly by a single implementation tool or an I-Set abstraction used and shared among one or more implementation tools.

Referring to FIG. 5A, the I-Set Factory 54 in the overall scheme 50 for implementing an integrated circuit design 51 is shown receiving a plurality of inputs 52 such as command line variables, environmental variables, and user constraint files. The I-Set factory 54 can maintain the integrated circuit design hierarchy in an I-Set hierarchy construction 53 and introduce additional I-Set hierarchy that is suitable for a particular implementation flow or a particular design tool. The factory 54 further assigns directives at block 55 in the process of producing a collection of I-Sets 56 which has the I-Set hierarchy annotated with directives which are used by client software 59. In conjunction with a behavior manager 58 and the client software 59 (such as circuit design tools), a list of tasks 57 can be generated from the directives which are associated with the collection of I-Sets. Finally, the client software 59 can either direct the execution or execute the tasks on the collection of I-Sets at block 60. Note that an I-Set abstraction can be created using the I-Set factory 54 as a single module in an implementation tool flow process performing both implementation set hierarchy construction (53) and implementation set directive assignment (55).

Figure 5B:
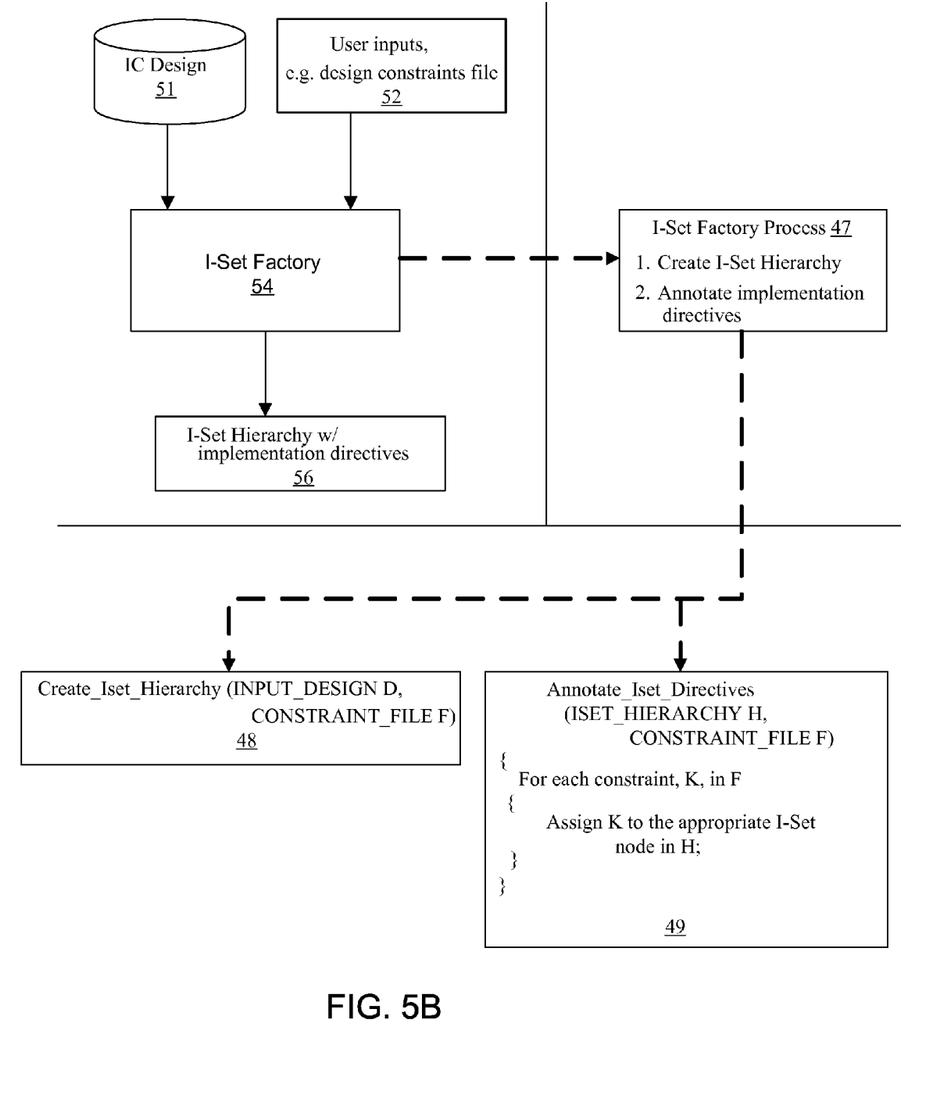
FIG. 5B shows an expanded view of the I-Set Factory of FIG. 5A of an embodiment of the present invention.

FIG. 5B shows an expanded view of the I-Set Factory 54 of an embodiment of the present invention. The same labels are used for FIGS. 5A and 5B where the blocks are the same or similar. The I-Set Factory 54 receives as inputs, the IC design 51 such as a Hardware Description Language (HDL) design created using the "Development System Reference Guide" from Xilinx Inc. of San Jose, Calif., Copyright 1994-2003, and user inputs 52 such as the design constraint file (for example, see the "Constraints Guide", ISE 6.1i from Xilinx Inc. of San Jose, Calif., Copyright 1994-2003. The I-Set Factory then produces a directed graph (I-Set hierarchy) whose nodes are annotated with the appropriate constraint in the design constraint file.

The I-Set Factory 54 includes two major functions (I-Set Factory Process 47): creating the I-set hierarchy using the pseudo code function Create_Iset Hierarchy (Input_Design D, Constraint_File_F) 48, and annotating the nodes of the I-set hierarchy using the pseudo code function Annotate_Iset Directives (Iset_hierarchy H, Constraint_File_F) 49.

The Create_Iset Hierarchy (Input_Design D, Constraint_File_F) 48 may receive, for example, a HDL input design using a modular design flow and an area group constraint. The input design may be created from a team of engineers that work independently on different pieces or modules of the design and then merge their pieces together to form one design (see Chapter 4 of the "Development System Reference Guide"). The input design can be improved by using an area group constraint, which enables partitioning of the modular design into physical regions for mapping, packing, placement, and routing. In this example, the Create_Iset Hierarchy function first forms the netlist of logic blocks for the input design in a root node. Next using, for example, the area group constraint, a first child I-set node is formed which has a subset of logic blocks from the netlist in the root node. This subset is removed from the root node, so that the netlist of logic blocks for the input design is now contained in the root node and first child node. Other child nodes may be formed. As the Create_Iset Hierarchy is an iterative (or recursive) procedure, each child node may then become a parent node with child nodes and so forth.

The pseudo code for Create_Iset Hierarchy (Input_Design D, Constraint_File_F) is given by:

```
{
    Create root I-Set node, R
    Add to R all the logic blocks in D
    For each design granularity defined in D and F
    {
        Determine parent I-Set (P) of design granularity
        Create a child I-Set node (C) under P;
        For each logic block member to C
        {
            Remove logic block from I-Set node P
            Add logic block to I-Set node C
        }
    }
}
```

Figure 5C:
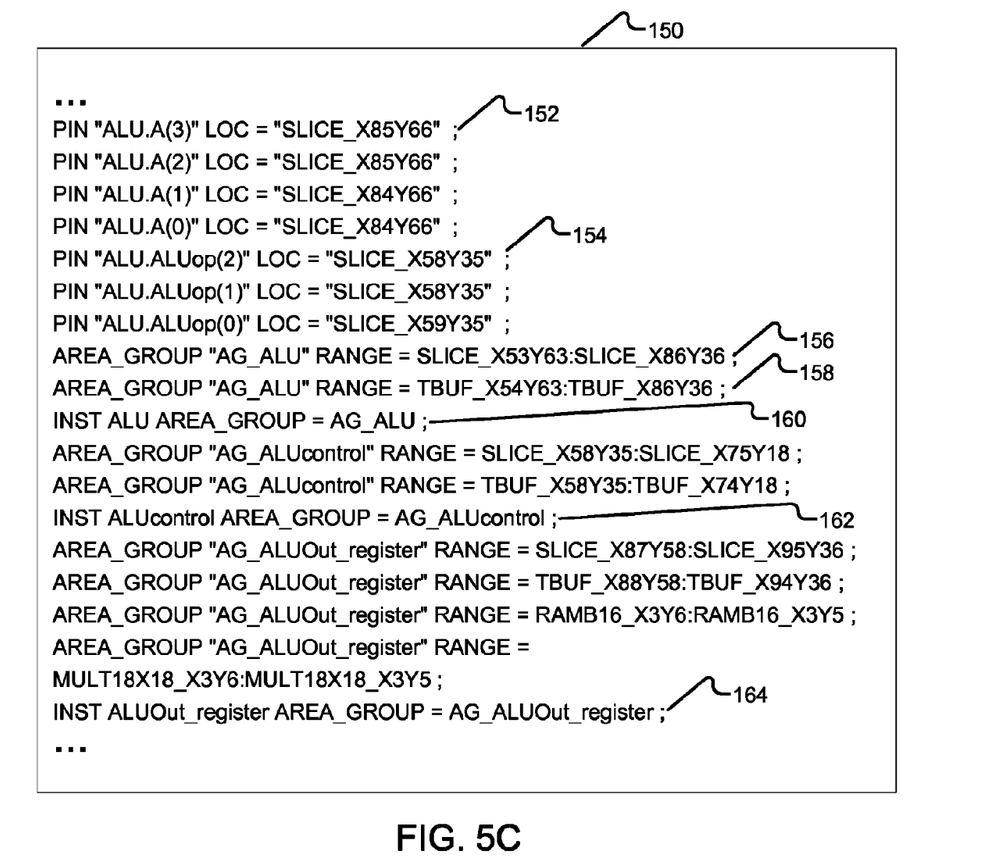
FIG. 5C shows part of a user constraint file (UCF).

FIG. 5C shows part of a user constraint file (UCF) 150 which is an example of user input 52 in FIG. 5B. The corresponding part of the IC design 51 includes ALU (arithmetic logic unit), ALUcontrol (ALU control circuit), and ALUOut_register (ALU output register) HDL modules. The UCF 150 assigns logic modules and I/Os in the HDL design to physical locations. For example, line 152 assigns the pin location for port A(3) of HDL module ALU to physical location SLICE_X85Y66 and line 154 assigns the pin location for port ALUop(2) of HDL module ALU to physical location SLICE_X58Y35. The area group AG_ALU has two ranges RANGE=SLICE_X53Y63:SLICE_X86Y36 (line 156) and RANGE=TBUF_X54Y63:TBUF_X86Y36 (line 158), where the range for the AG_ALU area group may be the union of these two ranges. Line 160 starting with INST, assigns the HDL logic module ALU in the IC design 51 to area group AG_ALU. In one embodiment with a 1-to-1 mapping, the I-Set Factory 54 assigns the ALU logic module with area group physical constraint AG_ALU to a first I-set. Similarly, in line 162 starting with INST, the HDL logic module ALUcontrol in the IC design 51 is assigned to area group AG_ALUcontrol and in line 164 starting with INST, the HDL logic module ALUOut_register in the IC design 51 is assigned to area group AG_ALUOut_register. Thus the second I-Set has the ALUcontrol logic module with area group physical constraint AG_ALUcontrol and the third I-Set has the ALUOut_register logic module with area group physical constraint AG_ALUOut_register.

Thus one embodiment of the present invention includes a computer system for implementing a circuit design on an integrated circuit (IC). The computer system includes a plurality of logic modules, such as HDL modules, representing the circuit design; a plurality of physical constraints (for example, area groups) on the IC for the plurality of logic modules, where the physical constraints are stored in a UCF; a software procedure (such as the I-Set factory) stored in a computer readable medium for producing a set (such as an I-Set), the set comprising a logic module of the plurality of logic modules and a corresponding physical constraint of the plurality of physical constraints.

Across each software flow (or prior existing flows), the I-Set factory is invoked to transform the appropriate net-list entities into a collection of I-Sets. The partial net-information of an I-Set is controlled by the mapping strategy chosen for the factory, either 1-to-1 or 1-to-many. Referring to FIG. 6, the various existing net-listing entities 63 (such as user floor-planned partitioning or Area Group, Active Module, Inactive Module, Hard Macro, Entire Design, PIM, or Soft IP Core) can be inputs into an I-Set Factory 64 which applies a pre-defined mapping in producing the collection of I-Sets 65. If a 1-to-1 mapping is chosen, then the I-Set factory does not require any user input and automatically generates the appropriate collections of I-Sets driven by the current software flow. On the other hand, if a 1-to-many mapping is used, then the I-Set factory can take user input and use it to customize or override internally generated I-Set collections. Also, it follows that the latter provides the most flexibility in producing I-Sets of varying implementation granularities.

Figure 7:
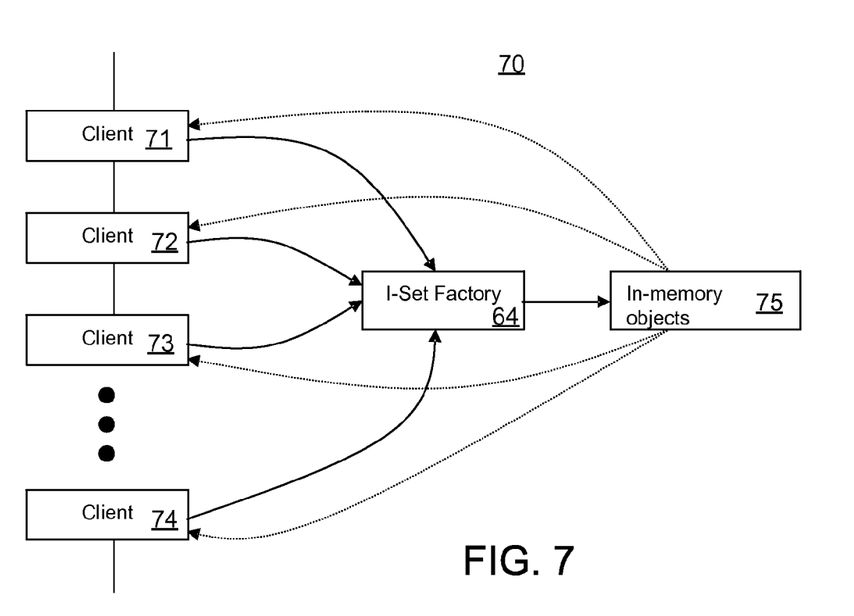
FIG. 7 illustrates how each client application in a software tool chain creates its own transient I-Set collections for its use in accordance with another embodiment of the inventive arrangements disclosed herein.

Under this paradigm, client applications can apply the I-Set factory method and produce the appropriate collections of I-Sets for a given software flow and sub-design. In one embodiment 70 of FIG. 7, each client application (71, 72, 73, and 74) uses the I-Set factory 64 to create one or more I-Set collections for its own use. Note that the I-Set collections can be either transient in-memory objects 75 or stored persistently on an external media 85 as shown in embodiment 80 of FIG. 8.

Figure 9:
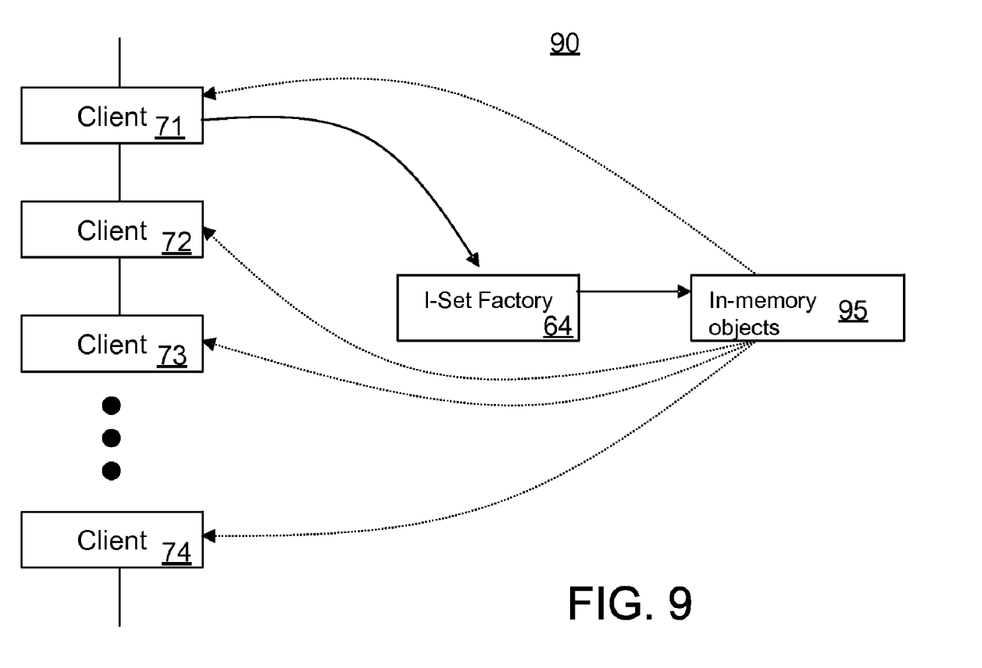
FIG. 9 illustrates how a client application in a software tool chain creates a set of transient I-Set collections in memory and shares the same collections with other client applications in accordance with another embodiment of the inventive arrangements disclosed herein.
Figure 10:
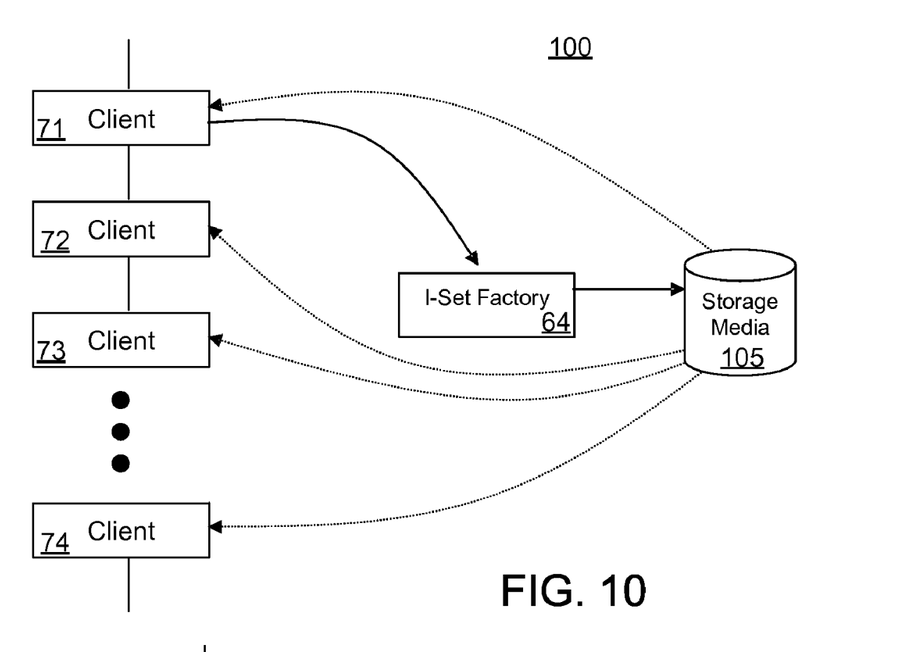
FIG. 10 illustrates how a client application in a software tool chain creates a persistent set of I-Set collections and shares the same collections with other client applications in accordance with another embodiment of the inventive arrangements disclosed herein.

In another embodiment 90 shown in FIG. 9, a client application 71 creates one or more I-Set collections for its use and the I-Set collections are shared and reused by other applications (72, 73, 74, etc). Again, the I-Set collections can be either transient or persistent objects stored as in-memory objects 95 or on external media 105 as shown in embodiment 100 of FIG. 10. Finally, a client application can attach client data to the I-Set collections to customize and store application specific data. This data can be either transient or persistent.

Figure 8:
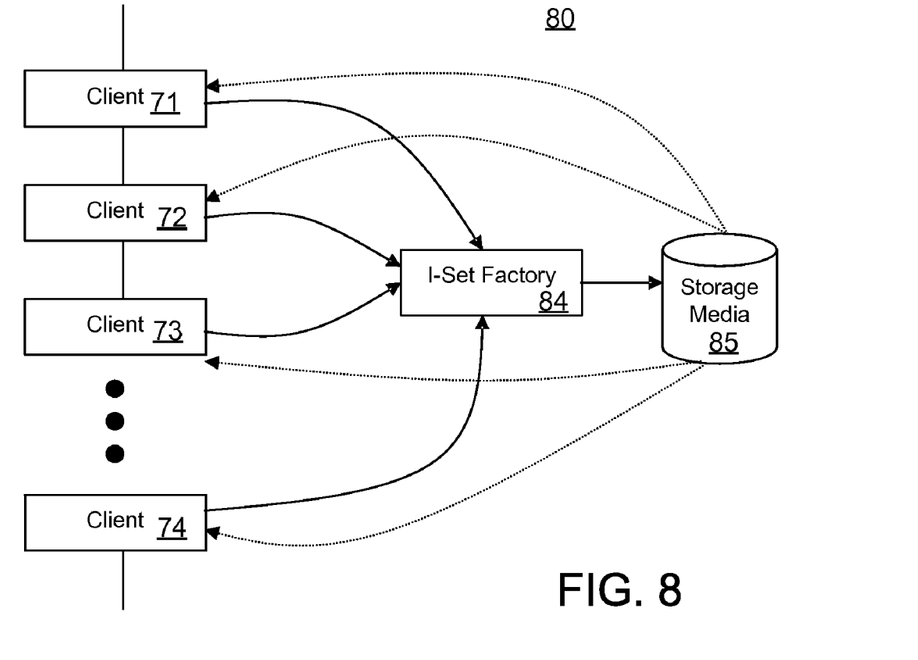
FIG. 8 illustrates how each client application in a software tool chain creates its own persistent I-Set collections in accordance with another embodiment of the inventive arrangements disclosed herein.
Figure 11:
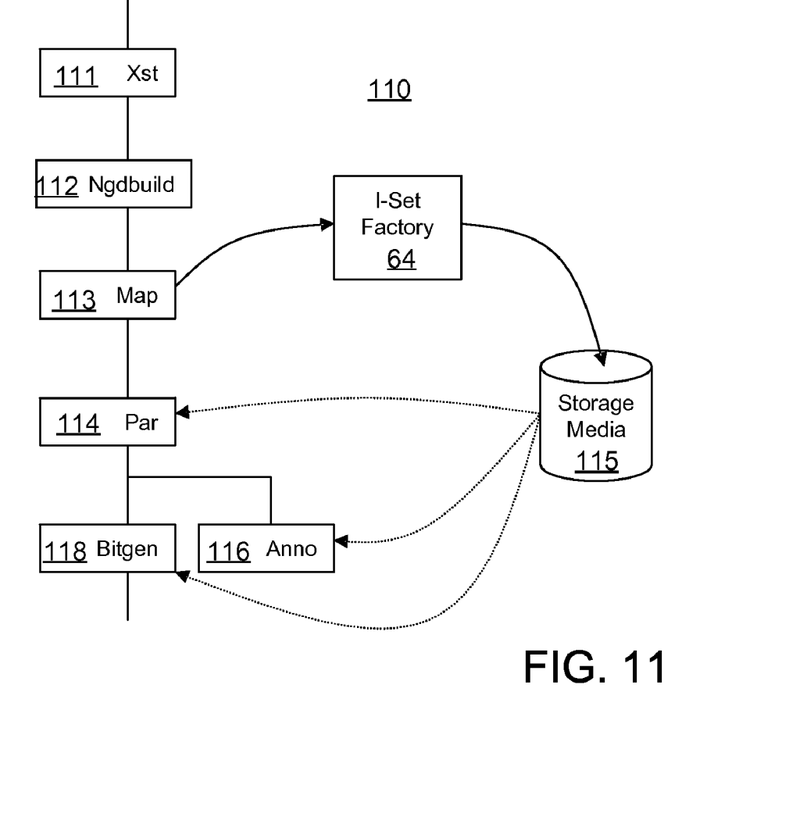
FIG. 11 illustrates an embodiment in accordance with the present invention using existing Xilinx Implementation Tools where a map tool creates persistent I-Set collections shared by other downstream client applications.

In a Xilinx implementation 110, shown in FIG. 11, the methodology used is based on the approach illustrated in FIG. 8. A chain of client applications such as tools 111, 112 and eventually a Map tool 113 create I-Set collections based on the user flows and stores the information persistently in a storage media 115 in a NCD file. Downstream tools such as par 114, bitgen 118, and anno 116 read and process I-Set information and perform the application's specific tasks. The I-Set factory uses a 1-to-1 mapping scheme to create the flow independent I-Set collections. Each user floor-planned partitioning (or area group) maps to a single I-Set, each module maps to a single I-Set, and the design maps to a single I-Set. Note that the term "module" refers to active module, inactive module, and PIMs.

With the introduction of I-Sets, the overall software effort and impact can be significantly minimized. Client applications no longer need to incur the software overhead needed to support the various and increasing number of design entities. In addition, the effort to support the growing list of net-list entities can be substantially reduced by supporting a single abstraction, namely, the I-Set.

The methods disclosed herein can be implemented by a software-based circuit design tool that can receive, pack, place, route or perform almost any of the functions either upstream or downstream in the circuit design process. As is known, placing refers to assigning components of a circuit design to physical locations on a chip and routing refers to routing signals, or forming connections, between components of the circuit design.

In addition to the benefits of unification of design granularities and providing a alternative abstraction as described above, the notion of an I-Set provides a series of other benefits. An I-Set is an abstraction that can facilitate both user grouping or partitioning (using constraints) and tool driven grouping. Examples of user groupings are the net-list entities or logic blocks previously mentioned such as user floor-planned partitioning or area group, inactive/active modules, previously implemented modules, hard macro, and soft IP core. Examples of tool driven groupings include automatic area group generation and clock region constraints.

I-Sets can further provide a unified framework/data model for a hierarchical design implementation paradigm that further provides accessible compilation points for both user and/or implementation tools. I-Sets also provide a unified data model for both the logical and physical domains. In terms of simplification of algorithms, I-Sets can reduce an original problem into smaller and independent instances such that each smaller instance is represented by an I-Set. Furthermore algorithms are enhanced to enable optimization along logic design boundaries, e.g. logic synthesis, technology mapping, and incremental placement and routing.

An I-Set paradigm enables a simplified software architecture where implementation tools have an unified and consistent method to access and query design logic (net-list entities) in each I-Set independent of the type of specific design granularity and implementation flow process. Using I-Sets, implementation tools can be insulated from any flow specific information. Furthermore, I-Sets enable parallel and concurrent processing of one or more implementation sets and likely improve implementation run-time.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A computer system for implementing a circuit design, the computer system comprising:
   a plurality of modules representing the circuit design, wherein the plurality of modules have a hierarchy;
   a plurality of physical constraints specifying locations for at least one of the plurality of modules for implementation on an integrated circuit (IC); and
   a non-transitory computer readable medium storing a software procedure for producing sets, wherein each set specifies an abstraction of a portion of the circuit design and comprises at least a portion of netlist entities of a module of the plurality of modules and a physical constraint of the plurality of physical constraints that applies to the at least a portion of netlist entities included in the set,
   wherein the software procedure is configured to generate a first collection of sets comprising a set and at least one child set organized according to a first set hierarchy, wherein the first set hierarchy preserves the hierarchy of the circuit design, and
   wherein the set of the first collection includes partial content of at least one of the plurality of modules.

2. The computer system of claim 1 wherein the software procedure is configured to generate a second collection of sets having a second set hierarchy that is different from the first set hierarchy and that preserves the hierarchy of the circuit design.

3. The computer system of claim 1 wherein the first collection of sets is generated responsive to a request from a first client system and the second collection of sets is generated responsive to a request from a second client system.

4. The computer system of claim 1 wherein the software procedure determines the partial content of the set of the first collection according to a mapping strategy selected from a plurality of different mapping strategies.

5. The computer system of claim 1 wherein the set includes partial content from at least two of the plurality of modules.

6. The computer system of claim 3 wherein the first set hierarchy is different from the hierarchy of the plurality of modules.

7. The computer system of claim 1 wherein the physical constraint within the set of the first collection is a physical constraint of the plurality of physical constraints that applies to the partial content of the set.

8. The computer system of claim 2 wherein each set specifies a reference to each netlist entity included within the set and each signal that connects with signals of netlist entities within the set, wherein each signal having connectivity only to netlist entities within the set is organized into an internal category and each signal having connectivity to a netlist entity not in the set is organized into an external category.

9. The computer system of claim 2 wherein the first collection is used by a first circuit design implementation tool and the second collection is used by a second circuit design implementation tool, wherein each collection is an alternative grouping of elements of the circuit design.

10. A method of implementing a circuit design on an integrated circuit (IC) comprising:
    identifying a plurality of modules representing the circuit design, wherein the plurality of modules have a hierarchy;
    selecting a mapping type that defines sets to include partial content of at least one of the plurality of modules, wherein each set specifies an abstraction of a portion of the circuit design;
    producing, by a computer system, a set according to the selected mapping type, wherein the set comprises at least a portion of content of at least one module of the plurality of modules and is annotated only with directives used by a client system that requested generation of the set from the circuit design; and generating a first collection of sets comprising the set and at least one child set organized according to a first set hierarchy that is different from the hierarchy of the plurality of modules and that preserves the hierarchy of the plurality of modules.

11. The method of claim 10, further comprising:
identifying a plurality of physical constraints on the IC associated with the plurality of modules; and
associating a physical constraint from the plurality of physical constraints that applies to the partial content within the set with the set.

12. The method of claim 10 further comprising:
generating a second collection of sets organized according to a second set hierarchy that is different from the first set hierarchy and that preserves the hierarchy of the plurality of modules.

13. The method of claim 12 further comprising:
generating the set to specify a reference to each netlist entity of a module included within the set and each signal that connects with signals of netlist entities within the set, wherein each signal having connectivity only to netlist entities within the set is organized into an internal category and each signal having connectivity to a netlist entity not in the set is organized into an external category.

14. The method of claim 12
wherein the first collection of sets is generated responsive to a request from a first client system and the second collection of sets is generated responsive to a request from a second client system.

15. The method of claim 12,
wherein the first collection is used by a first circuit design implementation tool and the second collection is used by a second circuit design implementation tool, wherein each collection is an alternative grouping of elements of the circuit design.

16. A non-transitory computer-readable medium storing computer-usable instructions that, when executed, configure a system for performing a plurality of steps for implementing a circuit design on an integrated circuit (IC), the steps comprising:
identifying a plurality of modules representing the circuit design, wherein the plurality of modules having a hierarchy;
selecting a mapping type that defines sets to include partial content of at least one of the plurality of modules, wherein each set specifies an abstraction of a portion of the circuit design;
producing a set according to the selected mapping type, wherein the set comprises at least a portion of content of at least one module of the plurality of modules and is annotated only with directives used by a client system that requested generation of the set from the circuit design; and
generating a first collection of sets comprising the set and at least one child set organized according to a first set hierarchy that is different from the hierarchy of the plurality of modules and that preserves the hierarchy of the plurality of modules.

17. The computer-readable medium of claim 16 further comprising instructions that, when executed, configure the system to perform steps comprising:
identifying a plurality of physical constraints on the IC associated with the plurality of modules; and
associating a physical constraint from the plurality of physical constraints that applies to the partial content within the set with the set.

18. The computer-readable medium of claim 16 further comprising instructions that, when executed, configure the system to perform a step comprising:
generating a second collection of sets organized according to a second set hierarchy that is different from the first set hierarchy and that preserves the hierarchy of the plurality of modules.

19. The computer-readable medium of claim 16 further comprising instructions that, when executed, configure the system to perform a step comprising:
generating the set to specify a reference to each netlist entity of a module included within the set and each signal that connects with signals of netlist entities within the set, wherein each signal having connectivity only to netlist entities within the set is organized into an internal category and each signal having connectivity to a netlist entity not in the set is organized into an external category.

20. The computer-readable medium of claim 18
wherein the first collection is used by a first circuit design implementation tool and the second collection is used by a second circuit design implementation tool, wherein each collection is an alternative grouping of elements of the circuit design.

* * * * *